United States Patent
Minamida (10) Patent No.: US 6,637,001 B1
(45) Date of Patent: Oct. 21, 2003

(54) APPARATUS AND METHOD FOR IMAGE/VOICE TRANSMISSION

(75) Inventor: Noriaki Minamida, Kanazawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 526 days.

(21) Appl. No.: 09/650,743

(22) Filed: Aug. 30, 2000

(51) Int. Cl.⁷ .................. H03M 13/05; H04N 17/00
(52) U.S. Cl. .................. 714/776; 348/192; 714/752
(58) Field of Search .................. 348/180, 192; 714/752, 776

(56) References Cited

U.S. PATENT DOCUMENTS 6,154,866 A * 11/2000 Kawahara et al. .......... 714/755
6,182,259 B1 * 1/2001 Oishi .......... 714/752

FOREIGN PATENT DOCUMENTS

| JP | 07184182 | 7/1995 | |
| JP | 08065278 A | * 3/1996 | ............ H04L/01/16 |
| JP | 08065278 | 8/1996 | |
| JP | 09149421 | 6/1997 | |

* cited by examiner

Primary Examiner—R. Stephen Dildine
(74) Attorney, Agent, or Firm—Stevens, Davis, Miller & Mosher, LLP (57) ABSTRACT

Voice coding section 101 generates voice data and image coding section 102 generates image data, an error decision bit is added to each of these data and these data are multiplexed and transmitted. On the receiving side, reception section 107 receives this multiplexed data, separation section 108 separates the multiplexed data into the voice data and image data. This voice data and image data are subjected to transmission error decision by voice reception code error decision section 109 and image reception code error decision section 110, respectively. Then, voice decoding section 111 decodes the voice data and image decoding section 112 decodes the image data.

8 Claims, 6 Drawing Sheets

APPARATUS AND METHOD FOR IMAGE/VOICE TRANSMISSION

BACKGROUND OF THE INVENTION

1. Field of the Invention

The present invention relates to an apparatus and method for image/voice transmission used in a communication field.

2. Description of the Related Art

In a conventional image/voice transmission apparatus, data error decision is performed only on codes after data multiplexing and when code errors occur in either an image or voice, both the image and voice are treated as having errors.

Figure 1:
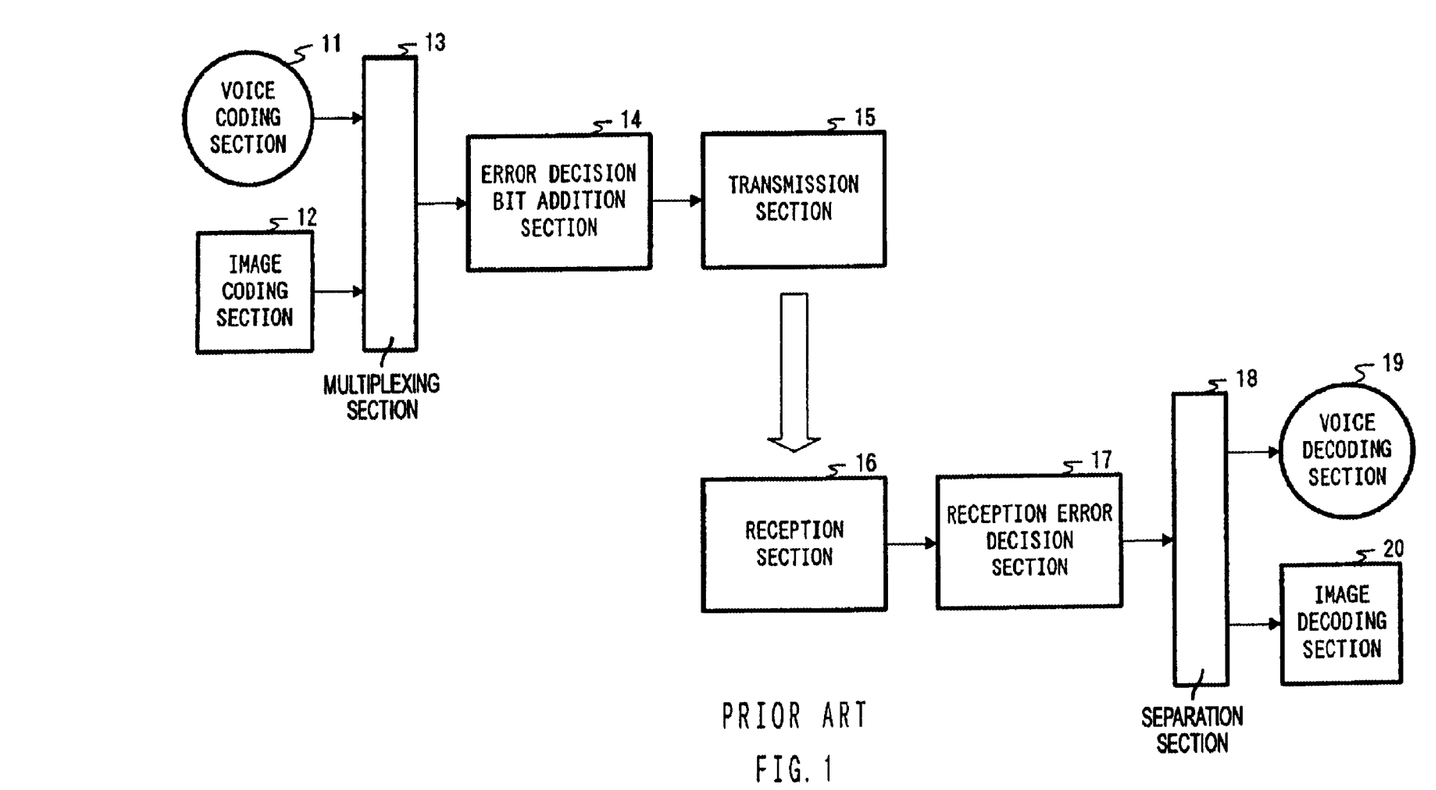
FIG. 1 is a block diagram showing a configuration of a conventional image/voice transmission apparatus.

FIG. 1 is a block diagram showing a configuration of a conventional image/voice transmission apparatus. The apparatus on the transmitting side comprises voice coding section 11 that encodes voice data, image coding section 12 that encodes image data, multiplexing section 13 that multiplexes coded voice data and image data, error decision bit addition section 14 that adds an error decision bit to the multiplexed data and transmission section 15 that sends the multiplexed data with the bit added to the apparatus on the receiving side.

On the other hand, the apparatus on the receiving side comprises reception section 16 that receives the data sent from the apparatus on the transmitting side, reception error decision section 17 that performs reception error decision on the received multiplexed data, separation section 18 that separates the data after error decision into voice data and image data, voice decoding section 19 that decodes the separated voice data and image decoding section 20 that decodes the separated image data.

In the apparatus on the transmitting side of the conventional image/voice transmission apparatus, when voice or an image is input, voice coding section 11 generates a voice code (voice data) and image coding section 12 generates an image code (image data). Then, multiplexing section 13 multiplexes the voice data and image data. Error decision bit addition section 14 adds an error decision bit to the multiplexed data. Then, the data with the bit added is sent from transmission section 15 to the apparatus on the receiving side.

In the apparatus on the receiving side, reception section 16 receives the multiplexed data with the error decision bit added and reception error decision section 17 performs error decision on the multiplexed data. When the data includes an error, the code string within the error decision range is normally discarded and a retransmission request is separately sent to the apparatus on the transmitting side. When the data includes no error, separation section 18 separates the multiplexed data into voice data and image data codes. Then, the separated voice data is decoded by voice decoding section 19 and output, and the separated image data is decoded by image decoding section 20 and output.

Since the above conventional image/voice transmission apparatus performs error decision on the reception data made up of multiplexed image data and voice data, even if the voice data has no error, when the image data includes an error, the multiplexed data is decided to have an error and this data is discarded. This results in a problem that decoding of voice data whose continuity is important from an auditory standpoint is interrupted.

SUMMARY OF THE INVENTION

It is an object of the present invention to provide an apparatus and method for image/voice transmission capable of effectively using voice data when multiplexed image data contains an error and voice data contains no error, and correctly and uninterruptedly decoding voice data.

A theme of the present invention is to add an error decision bit to image data and voice data independently before multiplexing these data, take advantage of the fact that error decision is performed on the reception data after the image and voice are separated and even if the code of the multiplexed image section contains an error, use the voice code data as valid data in the case where the voice section data contains no error.

Thus, even if the code of the multiplexed image section contains an error, in the case where the voice section data contains no error, it is possible to use the voice code data as valid data. Thus, decoding of voice whose continuity is important from an auditory standpoint can be performed uninterruptedly.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE PREFERRED EMBODIMENTS

With reference now to the attached drawings, embodiments of the present invention will be explained in detail below.

Embodiment 1

Figure 2:
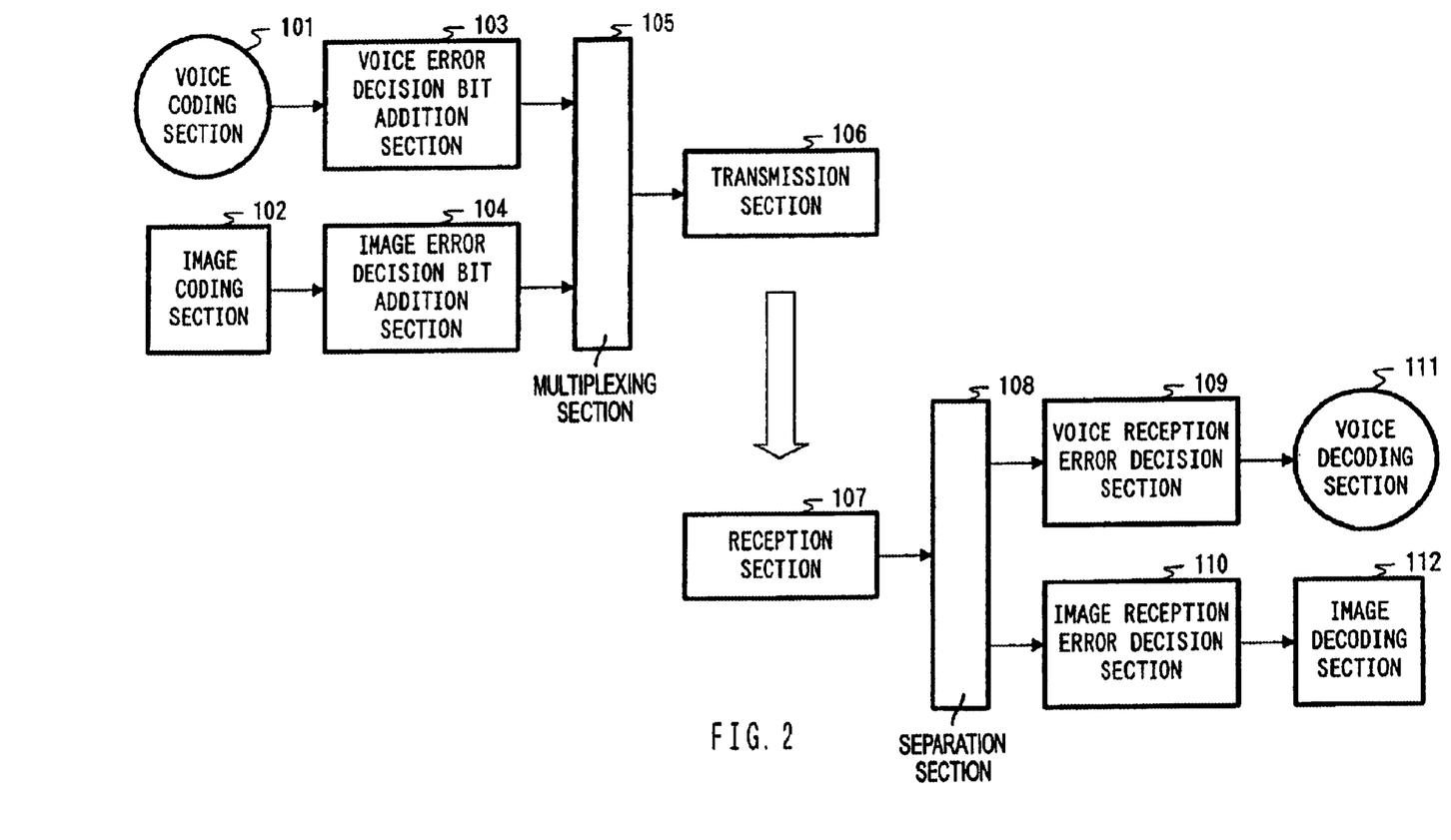
FIG. 2 is a block diagram showing a configuration of an image/voice transmission apparatus according to Embodiment 1 of the present invention.

FIG. 2 is a block diagram showing a configuration of an image/voice transmission apparatus according to Embodiment 1 of the present invention.

The apparatus on the transmitting side comprises voice coding section 101 that inputs voice and encodes voice data, image coding section 102 that inputs an image and encodes the image data, voice error decision bit addition section 103 that adds a voice error decision bit to the coded voice data, image error decision bit addition section 104 that adds an image error decision bit to the coded image data, multiplexing section 105 that multiplexes the voice data with a bit added and image data with a bit added and transmission section 106 that sends the multiplexed data to the apparatus on the receiving side.

On the other hand, the apparatus on the receiving side comprises reception section 107 that receives the multiplexed data sent from the transmitting side, separation section 108 that separates the multiplexed data into voice data and image data, voice reception error decision section 109 that carries out error decision on the voice data, image reception error decision section 110 that carries out error decision on the image data, voice decoding section 111 that decodes the voice data after error decision and image decoding section 112 that decodes the image data after error decision.

In the image/voice transmission apparatus with the above configuration, when voice and an image are given from outside the apparatus, first, voice coding section 101 equipped with a voice input section generates voice data from the voice, image coding section 102 equipped with an image input section generates image data from the image.

Then, voice error decision bit addition section 103 adds a decision bit used for voice error decision to the voice data, and likewise, image error decision bit addition section 104 adds a decision bit used for image error decision to the image data. These data with their respective error decision bits added are multiplexed by multiplexing section 105 and sent from transmission section 106 to the apparatus on the receiving side.

The reception section 107 receives the transmitted data and separation section 108 separates the data into the voice data and image data with their respective error decision codes added. The voice data and image data separated by separation section 108 are separately sent to voice reception code error decision section 109 and image reception code error decision section 110 and subjected to transmission error decision, respectively.

In the case where the decision result about the image data shows an error, the image data is either discarded after sending a retransmission request or discarded without sending a retransmission request. Here, the data is simply discarded.

On the other hand, in the case where the voice data contains an error, the voice data is subjected to interpolation processing similar to the processing carried out by a voice decoder of a current digital cellular phone to improve the auditory quality.

Then, voice decoding section 111 equipped with a voice output section decodes and outputs the voice data obtained and image decoding section 112 equipped with an image output section decodes and outputs the image data obtained.

As described above, since the image/voice transmission apparatus according to this embodiment is equipped with independent reception error decision apparatuses for voice and image data, even if the image data contains an error and it is difficult to decode the image data, it is possible to decode the voice data whose continuity is important from an auditory standpoint.

Embodiment 2

Figure 3:
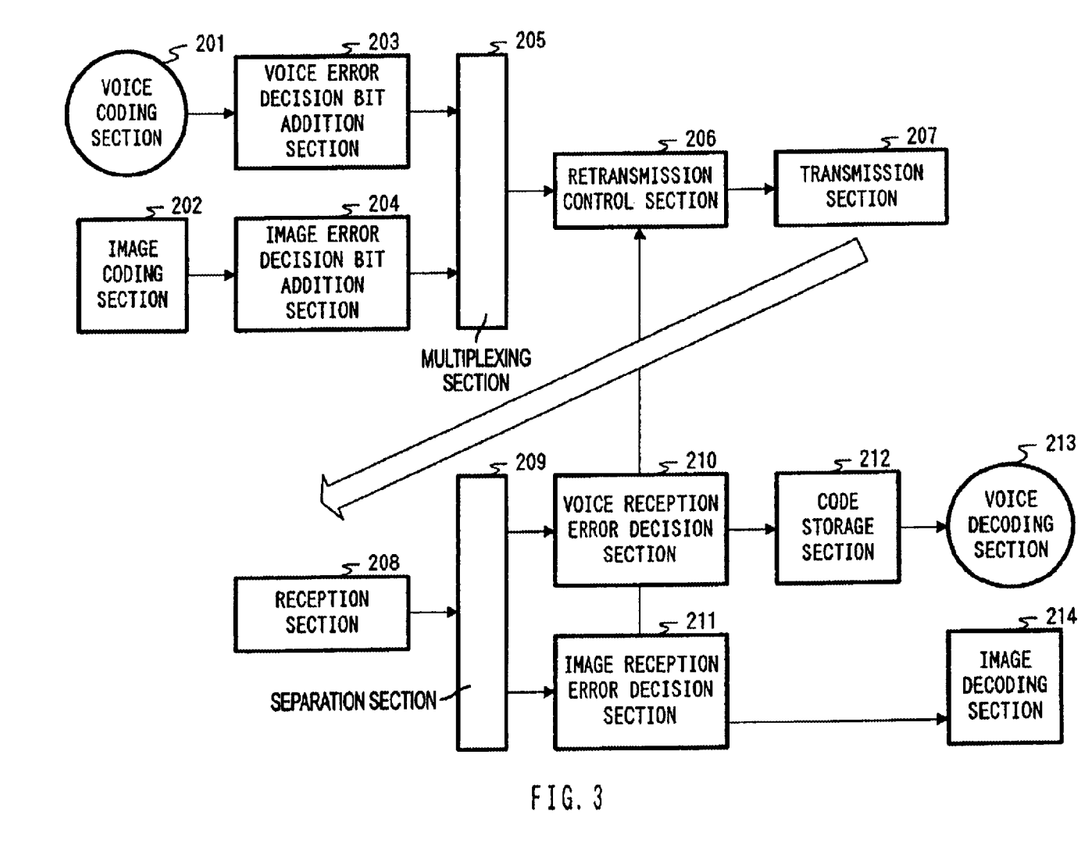
FIG. 3 is a block diagram showing a configuration of an image/voice transmission apparatus according to Embodiment 2 of the present invention.

FIG. 3 is a block diagram showing a configuration of an image/voice transmission apparatus according to Embodiment 2 of the present invention.

The apparatus on the transmitting side comprises voice coding section 201 that inputs voice and encodes voice data, image coding section 202 that inputs an image and encodes the image data, voice error decision bit addition section 203 that adds a voice error decision bit to the coded voice data, image error decision bit addition section 204 that adds an image error decision bit to the coded image data, multiplexing section 205 that multiplexes the voice data with a bit added and image data with a bit added, retransmission control section 206 that controls data retransmission under instructions from an image reception error decision section, which will be described later, and transmission section 207 that sends the multiplexed data to the apparatus on the receiving side.

On the other hand, the apparatus on the receiving side comprises reception section 208 that receives the multiplexed data sent from the transmitting side, separation section 209 that separates the multiplexed data into voice data and image data, voice reception error decision section 210 that carries out error decision on the voice data, image reception error decision section 211 that carries out error decision on the image data, code storage section 212 that stores the voice data, voice decoding section 213 that decodes the voice data after error decision and image decoding section 214 that decodes the image data after error decision.

Figure 4:
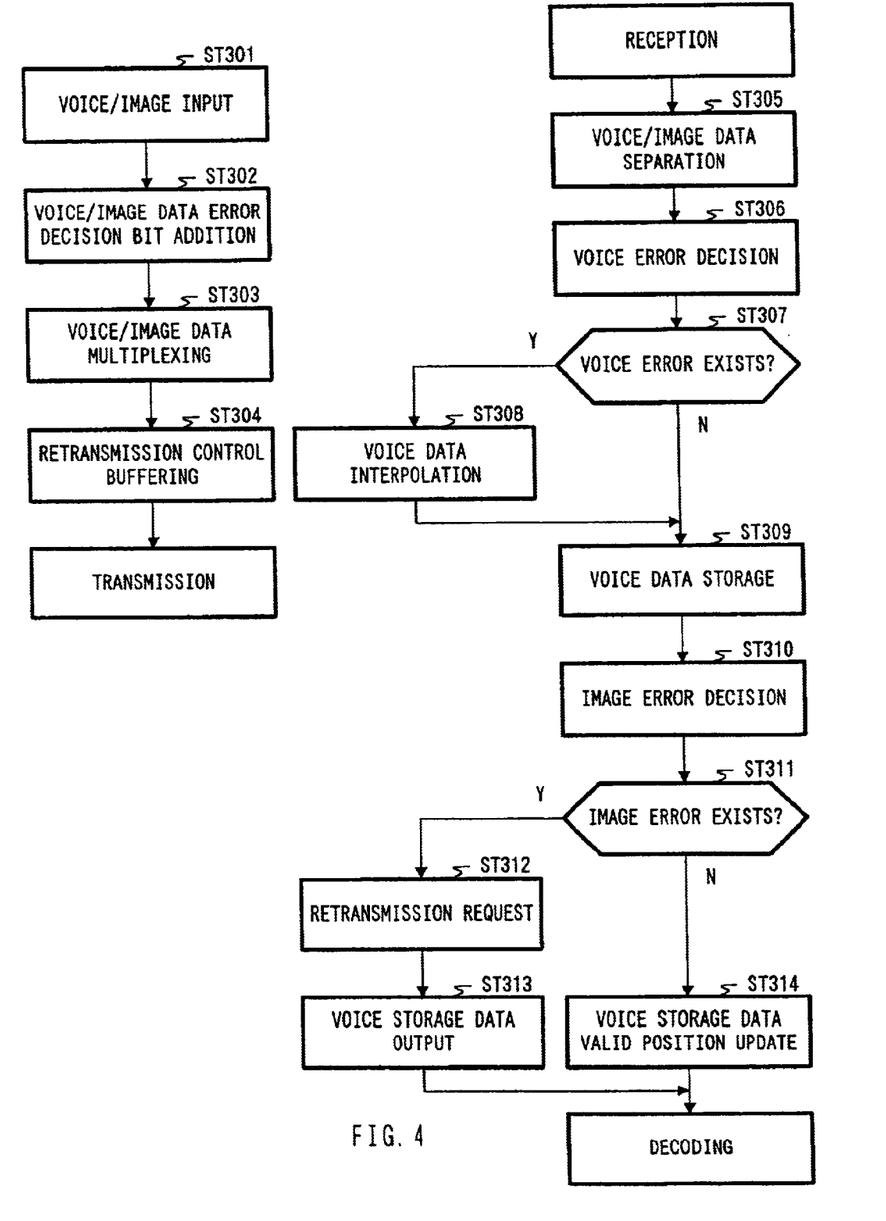
FIG. 4 a flow chart showing an operation of an image/voice transmission apparatus according to Embodiment 3 of the present invention.

The operation of the image/voice transmission apparatus with the above configuration will be explained using a flow chart shown in FIG.4. In step (hereinafter, abbreviated as "ST") 301, voice and an image are input from outside the apparatus. Voice coding section 201 equipped with a voice input section generates voice data from the voice, image coding section 202 equipped with an image input section generates image data from the image.

Then, in ST 302, voice error decision bit addition section 203 adds a decision bit used for voice error decision to the voice data, and likewise, image error decision bit addition section 204 adds a decision bit used for image error decision to the image data. In ST 303, these data with their respective error decision bits added are multiplexed by multiplexing section 205. In ST 304, the multiplexed data is given to retransmission control section 206. Then, the buffered and multiplexed data is sent from transmission section 207 to the apparatus on the receiving side.

In ST 305, reception section 208 of the apparatus on the receiving side receives the transmitted data and separation section 209 separates the data into the voice data and image data with their respective error decision bits added. The voice data and image data separated by separation section 209 are separately sent to voice reception code error decision section 210 and image reception code error decision section 211 and subjected to transmission error decision respectively (ST 306).

In ST 307, voice reception code error decision section 210 decides whether the voice decision result contains an error or not. In ST 308, in the case where the voice decision result contains an error, interpolation processing such that carried out by a voice decoder of a current digital cellular phone is carried out on the voice data. This allows the voice quality to be improved in the auditory sense. In ST 309, the voice data obtained is temporarily stored in voice code storage section 212.

In ST 310, image reception code error decision section 211 decides whether the image decision result contains an error or not. In ST 311, in the case where the image decision result shows an error, either the data is discarded after a retransmission request about the image data is sent or the data is discarded without sending any retransmission request. In ST 312, the retransmission request is sent to retransmission control section 206 of the apparatus on the transmitting side and the multiplexed data is retransmitted under instructions from retransmission control section 206. In ST 313, after a certain period of time has passed after the time at which the data was stored, the voice data is output from voice code storage section 212.

Furthermore, in ST 314, in the case where the image decision result contains no error, the valid position of the stored voice data is updated so that the stored voice data matches the image data retransmitted. Then, the voice data is decoded by voice decoding section 213 and the image data is decoded by image decoding section 214.

As described above, the image/voice transmission apparatus according to this embodiment is equipped with independent reception error decision apparatuses for voice data and image data, and it is possible to provide the voice data with a certain delay, reproduce the voice even while retransmission of the image data is being controlled, improve continuity of the voice and improve the auditory quality.

Embodiment 3

Figure 5:
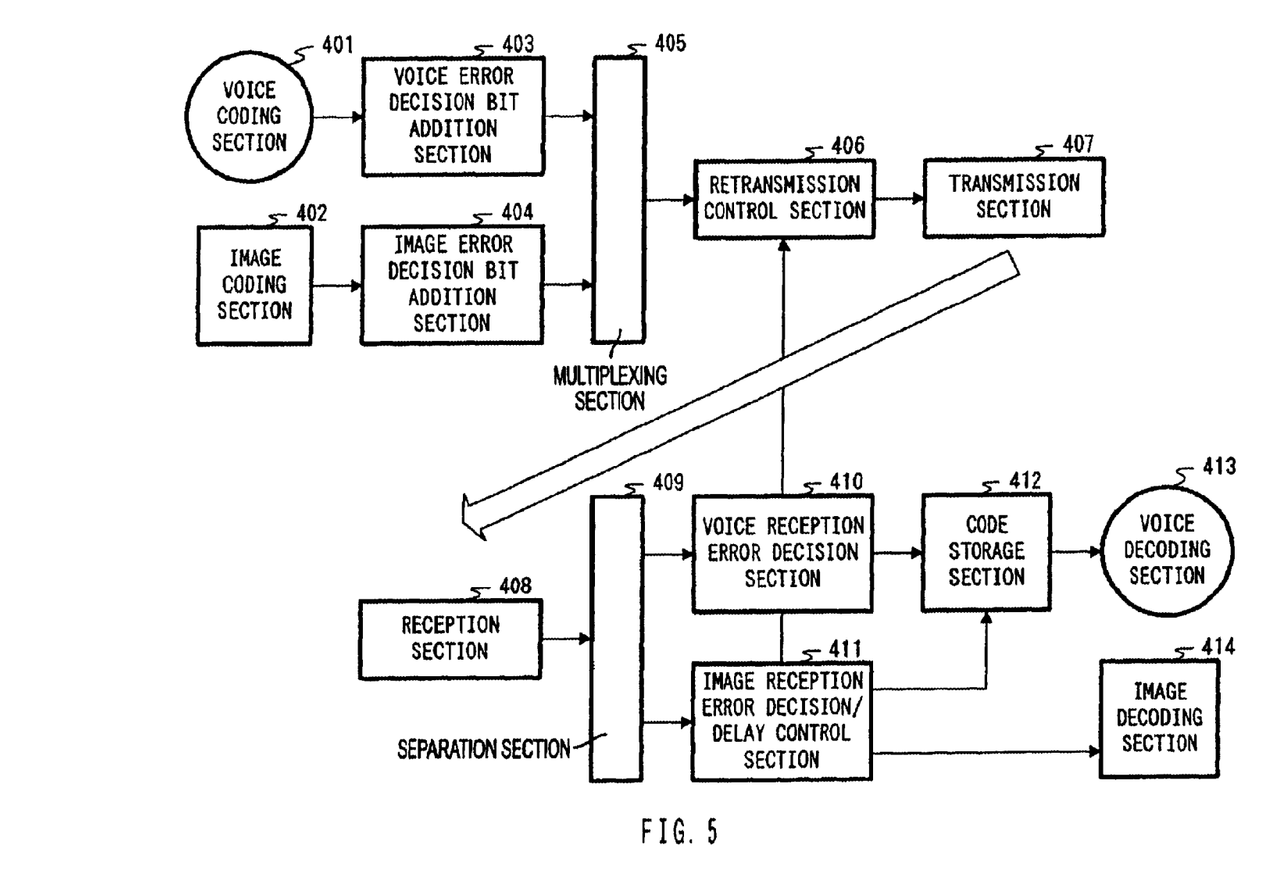
FIG. 5 is a block diagram showing a configuration of the image/voice transmission apparatus according to Embodiment 3 of the present invention.

FIG. 5 is a block diagram showing a configuration of an image/voice transmission apparatus according to Embodiment 3 of the present invention.

The apparatus on the transmitting side comprises voice coding section 401 that inputs voice and encodes voice data, image coding section 402 that inputs an image and encodes the image data, voice error decision bit addition section 403 that adds a voice error decision bit to the coded voice data, image error decision bit addition section 404 that adds an image error decision bit to the coded image data, multiplexing section 405 that multiplexes the voice data with a bit added and image data with a bit added, retransmission control section 406 that controls data retransmission under instructions from an image reception error decision section, which will be described later, and transmission section 407 that sends the multiplexed data to the apparatus on the receiving side.

On the other hand, the apparatus on the receiving side comprises reception section 408 that receives the multiplexed data sent from the transmitting side, separation section 409 that separates the multiplexed data into voice data and image data, voice reception error decision section 410 that carries out error decision on the voice data, image reception error decision/delay control section 411 that carries out error decision and timing control on the image data, code storage section 412 that stores the voice data, voice decoding section 413 that decodes the voice data after error decision and image decoding section 414 that decodes the image data after error decision.

In the image/voice transmission apparatus with the above configuration, when voice and an image are given from outside the apparatus, first, voice coding section 401 equipped with a voice input section generates voice data from the voice, image coding section 402 equipped with an image input section generates image data from the image.

Then, voice error decision bit addition section 403 adds a decision bit used for voice error decision to the voice data, and likewise, image error decision bit addition section 404 adds a decision bit used for image error decision to the image data. These data with their respective error decision bits added are multiplexed by multiplexing section 405, temporarily given to retransmission control section 406 and then sent from transmission section 407 to the apparatus on the receiving side.

The reception section 408 receives the transmitted data and separation section 409 separates the data into the voice data and image data with their respective error decision codes added. The voice data and image data separated by separation section 409 are separately sent to voice reception code error decision section 410 and image reception code error decision/delay control section 411 and subjected to transmission error decision, respectively.

In the case where the decision result about the image data shows an error, the image data is either discarded after sending a retransmission request or discarded without sending any retransmission request. Here, the retransmission request is sent to retransmission control section 406 on the transmitting side and the multiplexed data is retransmitted according to the instruction.

On the other hand, if the voice decision result contains an error, the voice data is subjected to interpolation processing similar to the processing carried out by a voice decoder of a current digital cellular phone to improve the auditory quality. The voice data obtained is temporarily stored in voice code storage section 412.

Voice code storage section 412 outputs voice data when, for example, a certain period of time has elapsed after the time at which the data was stored and voice decoding section 413 decodes and outputs the data. Image decoding section 414 decodes and outputs the image data obtained.

At this time, in the case where the multiplexed data is retransmitted and the same voice data as that stored in voice code storage section 412 is sent, image reception code error decision/delay control section 411 shows voice code storage section 412 the valid voice data part of the stored voice data, thus preventing the same data from being reproduced two or more times.

As described above, since the image/voice transmission apparatus according to this embodiment is equipped with independent reception error decision apparatuses for voice data and image data, and the voice data is provided with a certain delay, thus making it possible to reproduce the voice even while retransmission of the image data is being controlled and decode voice data correctly even in the case of retransmission.

Embodiment 4

Figure 6:
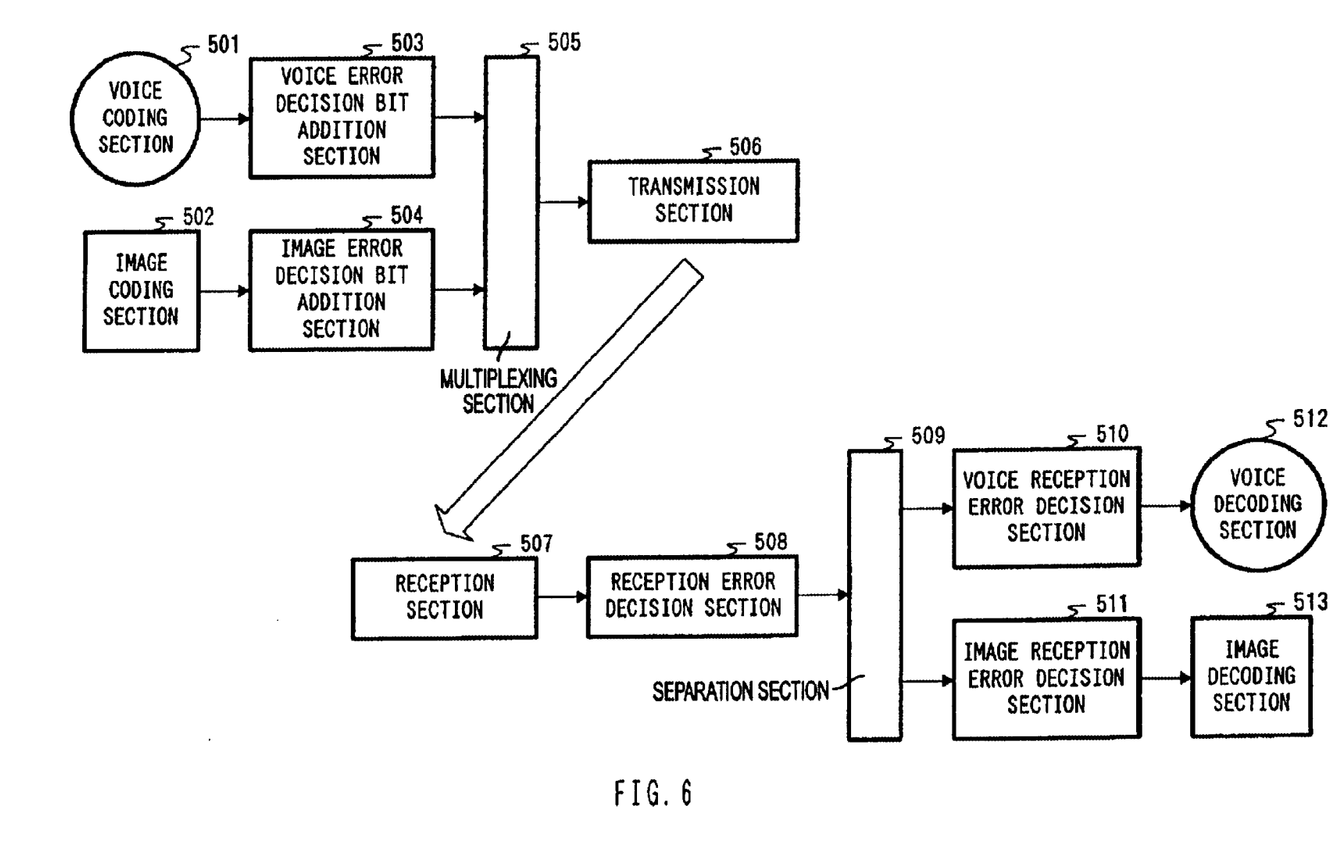
FIG. 6 is a block diagram showing a configuration of an image/voice transmission apparatus according to Embodiment 4 of the present invention.

FIG. 6 is a block diagram showing a configuration of an image/voice transmission apparatus according to Embodiment 4 of the present invention.

The apparatus on the transmitting side comprises voice coding section 501 that inputs voice and encodes voice data, image coding section 502 that inputs an image and encodes the image data, voice error decision bit addition section 503 that adds a voice error decision bit to the coded voice data, image error decision bit addition section 504 that adds an image error decision bit to the coded image data, multiplexing section 505 that multiplexes the voice data with a bit added and image data with a bit added and transmission section 506 that sends the multiplexed data to the apparatus on the receiving side.

On the other hand, the apparatus on the receiving side comprises reception section 507 that receives the multiplexed data sent from the transmitting side, reception error decision section 508 that performs error decision on the multiplexed data, separation section 509 that separates the multiplexed data into voice data and image data, voice reception error decision section 510 that carries out error decision on the voice data, image reception error decision section 511 that carries out error decision on the image data, voice decoding section 512 that decodes the voice data after error decision and image decoding section 513 that decodes the image data after error decision.

In the image/voice transmission apparatus with the above configuration, when voice and an image are given from outside the apparatus, first, voice coding section 501 equipped with a voice input section generates voice data from the voice, image coding section 502 equipped with an image input section generates image data from the image.

Then, voice error decision bit addition section 503 adds a decision bit used for voice error decision to the voice data, and likewise, image error decision bit addition section 504 adds a decision bit used for image error decision to the image data. These data with their respective error decision bits added are multiplexed by multiplexing section 505 and then sent from transmission section 506 to the apparatus on the receiving side.

The reception section 507 receives the transmitted data and reception error decision section 508 performs reception error decision on the received multiplexed data. This decides whether the multiplexed data contains an error or not.

Then, separation section 509 separates the data into the voice data and image data with their respective error decision codes added. The voice data and image data separated by separation section 509 are separately sent to voice reception code error decision section 510 and image reception code error decision section 511 and subjected to transmission error decision, respectively.

In the case where the decision result about the image data shows an error, the image data is either discarded after sending a retransmission request or discarded without sending any retransmission request. Here, the data is simply discarded.

On the other hand, if the voice data contains an error, the voice data is subjected to interpolation processing similar to the processing carried out by a voice decoder of a current digital cellular phone to improve the auditory quality.

Then, voice decoding section 512 equipped with a voice output section decodes and outputs the voice data obtained and image decoding section 513 decodes and outputs the image data obtained.

As described above, since the image/voice transmission apparatus according to this embodiment is equipped with independent reception error decision apparatuses for voice data and image data, even if the image data contains an error and it is difficult to decode the image data, it is possible to decode the voice data whose continuity is important from an auditory standpoint.

The embodiments above describe the case where decision on the image data is performed after decision on the voice data is performed, but in the present invention, either decision on the voice error or decision on the image error can be performed first or both can be performed at the same time. Moreover, the above embodiments can be implemented in combination as appropriate.

The image/voice transmission apparatus of the present invention has a configuration comprising a data separation section that separates multiplexed data into image data and voice data and a 1st error decision section that performs error decision on the separated image data and voice data individually.

The image/voice transmission method of the present invention comprises a data separating step of separating multiplexed data into image data and voice data and a 1st error decision step of performing error decision on the separated image data and voice data individually.

According to this apparatus and method, since the image/voice transmission apparatus is equipped with independent reception error decision apparatuses for voice data and image data, even if the image data contains an error, it is possible to decode the voice data.

In the image/voice transmission apparatus of the present invention with the above configuration, the 1st error decision section comprises a voice data error decision section equipped with a data storage section that stores voice data and an image data error decision section.

In the image/voice transmission method of the present invention with the above method, the 1st error decision step includes voice data error decision and image data error decision and stores voice data after voice data error decision.

According to this apparatus and method, it is possible to store voice data and decode the voice data after delaying it for a certain period of time. Thus, even if an error occurs in only the image data, it is possible to control timing and reproduce the voice.

In the image/voice transmission apparatus of the present invention with the above configuration, the image data error decision section sends a retransmission request to the transmitting side when an error occurs in the image data.

In the image/voice transmission method of the present invention with the above method, a retransmission request is sent to the transmitting side when an error is detected in the image data in image data error decision.

According to this apparatus and method, it is possible to obtain accurate image data and decode image data reliably.

In the image/voice transmission apparatus of the present invention with the above configuration, the data storage section has a configuration of extracting valid data from the retransmitted voice data.

In the image/voice transmission method of the present invention with the above method, valid data is extracted from the retransmitted voice data.

According to this apparatus and method, it is possible to prevent voice data from being decoded repeatedly when the image data is retransmitted.

In the image/voice transmission apparatus of the present invention with the above configuration, the image data error decision section has a configuration of delaying decoding of the voice data when the image data has an error.

In the image/voice transmission method of the present invention with the above method, decoding of the voice data is delayed when an error is detected in the image data in image decision.

According to this apparatus and method, it is possible to reproduce the voice even while retransmission of the image data is being controlled and decode normal voice data even when retransmission is performed.

The image/voice transmission apparatus of the present invention with the above configuration comprises a second error decision section that performs error decision on the multiplexed data.

In the image/voice transmission method of the present invention, the above method comprises a 2nd error decision step that performs error decision on the multiplexed data.

According to this apparatus and method, since it is decided whether the multiplexed data contains an error or not, it is possible to decode voice data and image data speedily if there is no error.

The image/voice transmission apparatus of the present invention has a configuration comprising a coding section that encodes image data and voice data individually, a bit addition section that adds error decision bits to the coded image data and voice data and a multiplexing section that multiplexes these image data and voice data.

The image/voice transmission method of the present invention comprises a coding step of coding image data and voice data individually, a bit addition step of adding error decision bits to the coded image data and voice data and a multiplexing step of multiplexing these image data and voice data.

According to this apparatus and method, since error decision bits are added to the image data and voice data, it is possible to perform error decision processing on the image data and voice data separately after reception.

As described above, the apparatus and method for voice/image transmission of the present invention adds error decision bits to image data and voice data independently before multiplexing these data and performs error decision on respective data separately after the image data and voice data are separated, and therefore even if an error exists in the code of the multiplexed image section, in the case where the voice section has no error, the voice code data can be used as valid data. Thus, it is possible to correctly and uninterruptedly decode the voice whose continuity is important from an auditory standpoint.

The present invention is not limited to the above described embodiments, and various variations and modifications may be possible without departing from the scope of the present invention.

This application is based on the Japanese Patent Application No.HEI 10-056190 filed on Feb. 20, 1998.

What is claimed is:

1. The image/voice transmission apparatus comprising:
   a data separator that separates multiplexed data into image data and voice data; and
   a first error decision section that performs error decision on the separated image data and voice data individually, wherein the first error decision section comprises a voice data error decision section having a data storage section that stores voice data and an image data error decision section.

2. The image/voice transmission apparatus according to claim 1, wherein, when the image data contains an error, the image data error decision means section sends a retransmission request to the transmitting side.

3. The image/voice transmission apparatus according to claim 2, wherein the data storage section extracts valid data of the retransmitted voice data.

4. The image/voice transmission apparatus according to claim 1, wherein, when the image data contains an error, the image data error decision section delays decoding of the voice data.

5. The image/voice transmission method comprising:
   the data separation step of separating multiplexed data into image data and voice data; and
   the first error decision step of performing error decision on the separated image data and voice data individually, wherein the first error decision step includes voice data error decision and image data error decision and stores the voice data after voice data error decision.

6. The image/voice transmission method according to claim 5, wherein, when an error is detected in the image data in image data error decision, a retransmission request is sent to the transmitting side.

7. The image/voice transmission method according to claim 6, wherein valid data of the retransmitted voice data is extracted.

8. The image/voice transmission method according to claim 5, wherein, when an error is detected in the image data in image data error decision, decoding of the voice data is delayed.

* * * * *